United States Patent
Archie et al.

[11] Patent Number: 6,025,600
[45] Date of Patent: Feb. 15, 2000

[54] METHOD FOR ASTIGMATISM CORRECTION IN CHARGED PARTICLE BEAM SYSTEMS

[75] Inventors: Charles N. Archie, Granite Springs, N.Y.; Steven R. Rogers, D.N. Emek Sorek, Israel; Eric P. Solecky, Hyde Park, N.Y.

[73] Assignees: International Business Machines Corporation, Armonk, N.Y.; Applied Materials, Inc., Santa Clara, Calif.

[21] Appl. No.: 09/086,692

[22] Filed: May 29, 1998

[51] Int. Cl.[7] .................................................. H01J 37/252
[52] U.S. Cl. .............................. 250/396 R; 250/396 ML; 250/310
[58] Field of Search ........................ 250/396 R, 396 ML, 250/310

[56] References Cited

U.S. PATENT DOCUMENTS

| | | | |
|---|---|---|---|
| 4,162,403 | 7/1979 | Baumgarten | 250/396 ML |
| 4,180,738 | 12/1979 | Smith et al. | 250/396 ML |
| 4,554,452 | 11/1985 | Suganuma | 250/310 |
| 4,567,369 | 1/1986 | Smith et al. | 250/397 |
| 5,047,646 | 9/1991 | Hattori et al. | 250/396 R |
| 5,144,129 | 9/1992 | Kobayashi et al. | 250/307 |
| 5,302,829 | 4/1994 | Komatsu et al. | 250/307 |
| 5,313,062 | 5/1994 | Yamada | 250/310 |
| 5,396,077 | 3/1995 | Sohda et al. | 250/492.2 |
| 5,627,373 | 5/1997 | Kesse | 250/310 |

OTHER PUBLICATIONS

S.J. Erasmus et al., "An automatic focusing and astigmatism correction system for the SEM and CTEM", Journal of Microscopy, vol. 127, Pt. 2, Aug. 1982, pp. 185–199.

Francis B. Hildebrand, "Methods of Applied Mathematics", Massachusetts Institute of Technology, Prentice–Hall, Inc., pp. 36–39 and 93.

Michael G. Rosenfield, "Measurement techniques for sub–micron resist images", J. Vac. Sci. Technology B 6(6), Nov./Dec. 1988, pp. 1944–1949.

P.W. Hawkes et al., "Principles of Electron Optics", Basic Geometrical Optics, vol. 1, pp. 516–521 pp. 617–621.

*Primary Examiner*—Kiet T. Nguyen
*Attorney, Agent, or Firm*—Ratner & Prestia; H. Daniel Schnurmann

[57] ABSTRACT

A method for calculating and correcting an astigmatism error in a charged particle beam system. Images are collected during a single focus sweep of the charged particle beam system. Different orientations of image features, such as lines on a stigmation target, are analyzed. Optimum sharpness or best focus values are obtained as a function of the objective lens settings. Appropriate changes to the settings of the astigmatism correctors are computed by taking a linear combination of optimum sharpness values associated with the different orientations of image features. Proper settings of the objective lens and the astigmatism correctors result in focusing of the beam into a "small" spot. In a scanning electron microscope, for example, two sets of quadrupole compensation coils are typically used as astigmatism correctors.

27 Claims, 11 Drawing Sheets

METHOD FOR ASTIGMATISM CORRECTION IN CHARGED PARTICLE BEAM SYSTEMS

TECHNICAL FIELD

The present invention relates generally to charged particle beam systems and, more specifically, to a method which enhances the focusing properties of the charged particle beam system through astigmatism correction.

BACKGROUND OF THE INVENTION

Figure 7:
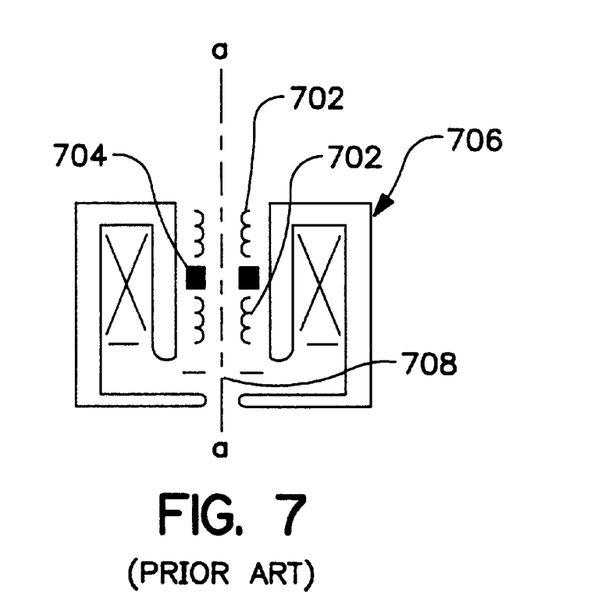
FIG. 7 is a cross-sectional view of an exemplary objective lens.

A typical goal of charged particle systems is to focus a particle beam into a small spot. This goal is accomplished using a column of magnetic and electrostatic lenses that set the focal properties of the beam. A cross-section of an exemplary column of magnetic and electrostatic lenses is shown in FIG. 7. Such a column includes an objective lens 706, a double deflection coil 702, a stigmator 704, and a beam limiting aperture 708. The column is disposed along a longitudinal axis a-a; the beam travels along this axis.

Figure 8A:
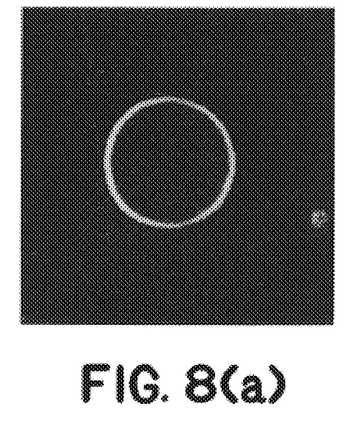
FIGS. 8(a), 8(b), 8(c), 8(d), and 8(e) illustrate an example image of a contact hole showing the effects of astigmatism.
Figure 8B:
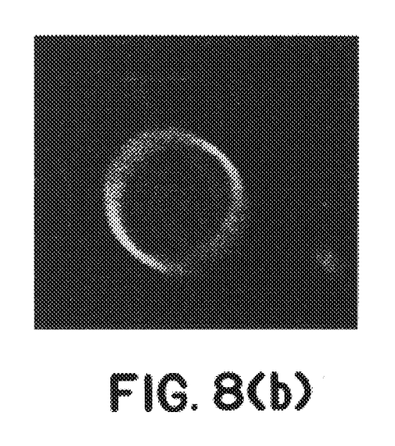
Figure 8C:
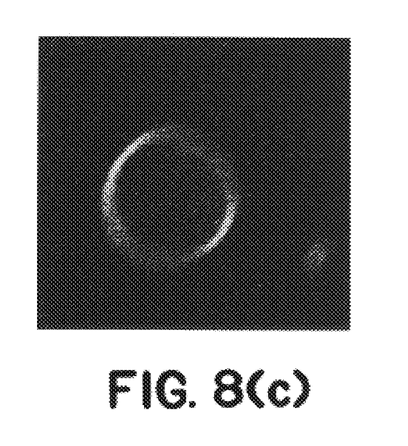
Figure 8D:
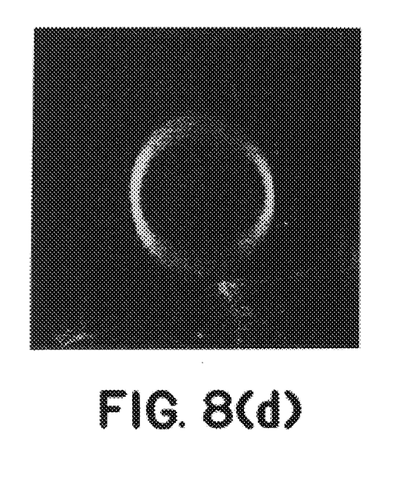
Figure 8E:
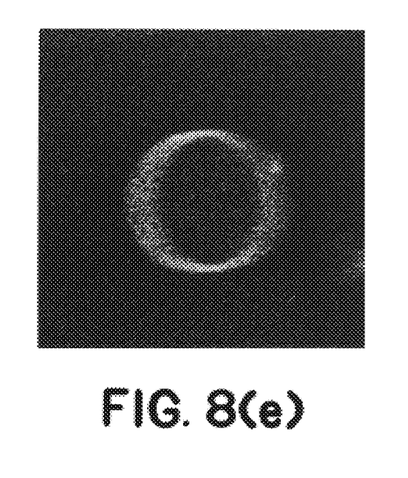

There are many imperfections in tools that use charged particle beams. These imperfections cause, in turn, imperfections in the focusing properties of the tool. One imperfection that prevents sharp focus is referred to as astigmatism. The causes of astigmatism may be traced to many sources: lens aberrations, mechanical misalignments, and particle contaminants, to name just a few. Specifically, astigmatism results in the focal length in some direction transverse to the direction of the charged beam to be different from the focal length in the orthogonal transverse direction. Simultaneous best focus in the two transverse directions (best focus) is thereby prevented. An example of the effects of astigmatism is shown in FIG. 8. FIG. 8(a) shows a gray scale image of a sample contact hole in optimal focus; FIGS. 8(b), 8(c), 8(d), and 8(e) show stigmated images of the same contact hole. FIG. 8(b) shows blurring of the contact hole image in the −45° direction transverse to the direction of the charged beam. FIG. 8(c) shows blurring of the contact hole image in the +45° direction transverse to the direction of the charged beam. FIG. 8(d) shows blurring of the contact hole image in the vertical direction transverse to the direction of the charged beam. FIG. 8(e) shows blurring of the contact hole image in the horizontal direction transverse to the direction of the charged beam.

To combat the problem of astigmatism, many charged particle beam systems are fitted with adjustable stigmator coils. These compensation coils are used to correct the accumulated effects of astigmatism along the path of the beam. For unknown reasons, however, the correct compensator settings tend to change a periodically.

Figure 9:
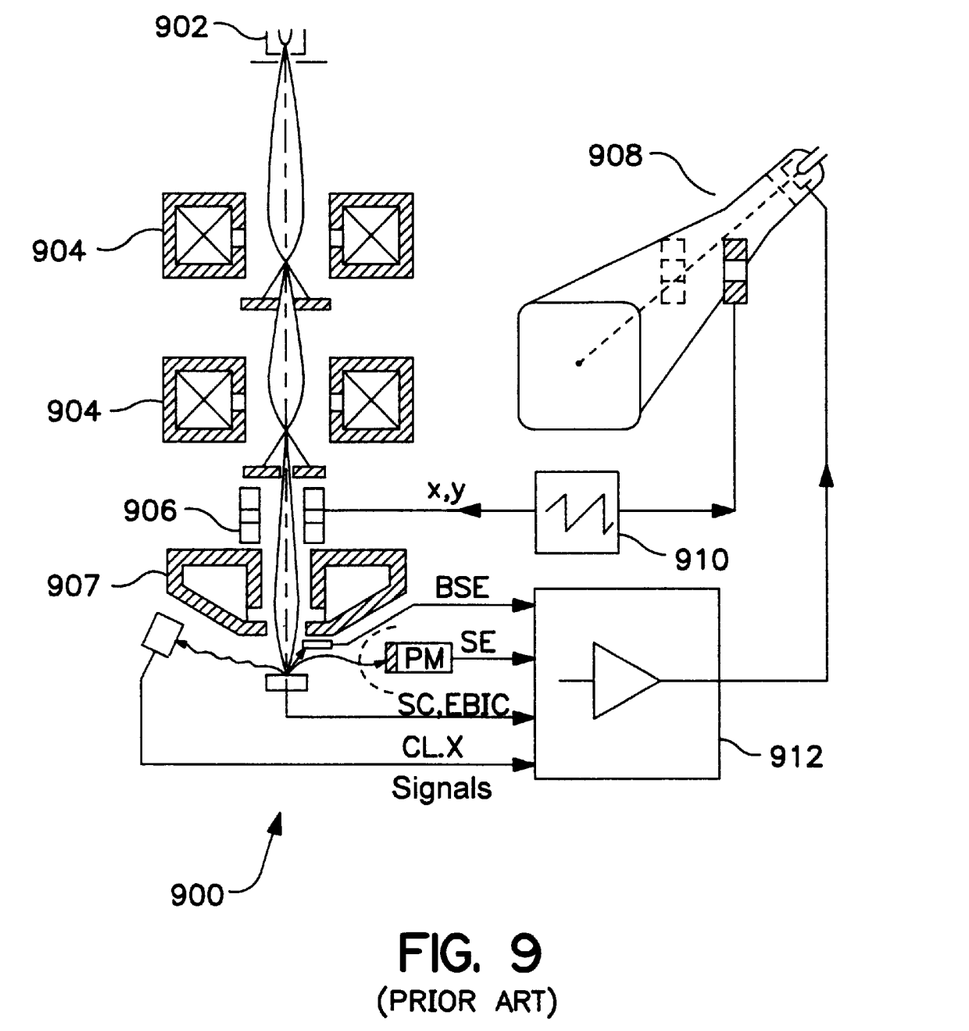
FIG. 9 is a cross-sectional view of an exemplary scanning electron microscope.

In particular, modern scanning electron microscopes (SEMs) are equipped with two sets of quadrupole compensation coils. FIG. 9 shows a schematic cross-section of a SEM 900. The SEM 900 includes: an electron gun 902, condenser lenses 904, scan coils 906, an objective lens 907, a cathode ray tube (CRT) 908, a scan generator 910, and an amplifier 912.

Figure 10A:
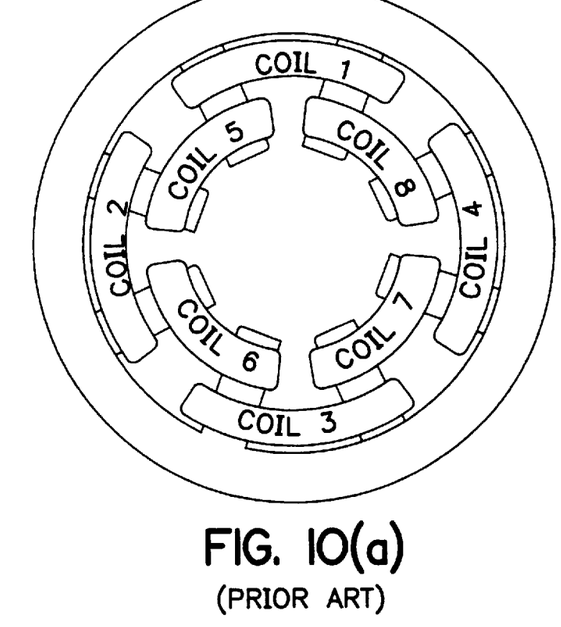
FIG. 10(a) is a cross-sectional view of an eight pole iron yoke that may be configured to produce two compensators.
Figure 10B:
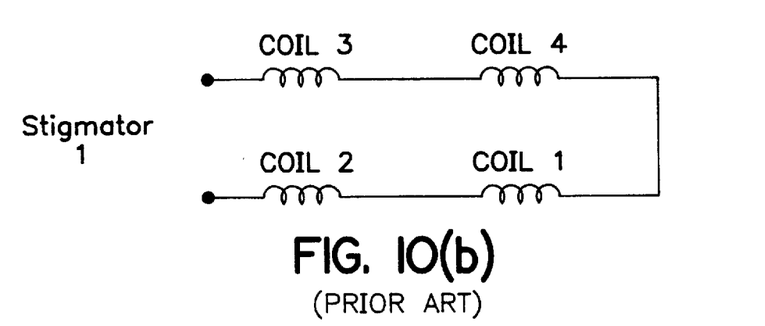
FIG. 10(b) illustrates a wiring schematic for the eight pole iron yoke shown in FIG. 10(a)
Figure 10C:
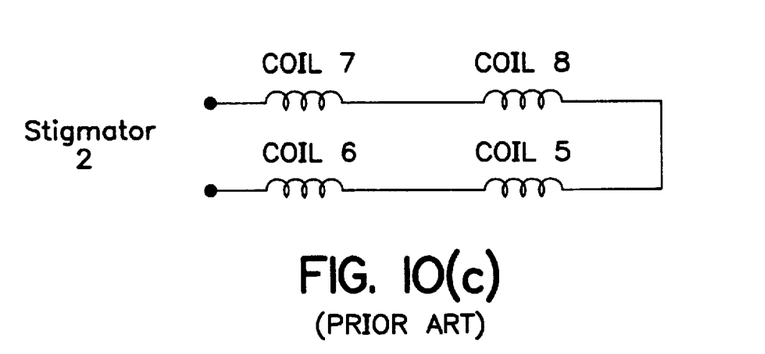
FIG. 10(c) illustrates a wiring schematic for the eight pole iron yoke shown in FIG. 10(a)

FIG. 10(a) shows a cross-section view of an eight-pole iron yoke that may be configured to produce two compensators. FIGS. 10(b) and 10(c) illustrate wiring schematics for the eight-pole iron yoke shown in FIG. 10(a). In many applications, such as semiconductor manufacturing, limitations in focusing properties or astigmatism in metrology tools is a major stumbling block. For example, as semiconductor manufacturing advances into the sub 0.18 $\mu$m domain, the requirements for focusing and astigmatism correction of critical dimension-SEMs (CD-SEMs) metrology tools have become so severe that human operators can no longer make these adjustments with sufficient accuracy and repeatability. Therefore, the development of sound and consistent methodologies for determining proper compensator coil settings is crucial.

The difficulty with using quadrupole lenses, which is a consequence of Maxwell's laws, is that adjustment of the focusing properties in one direction causes defocusing in an orthogonal direction. In order to properly focus the beam, the settings of the quadrupole compensation coils should be adjusted in at least two directions simultaneously with an optimization of the main objective lens excitation.

Adjustments to corrector quadrupole lenses are often performed by human operators. Human operators use subjective criteria to determine the optimal quadrupole compensation settings. This presents serious difficulties: two different measurements performed by the same tool on the same specimen, each time having been adjusted by a different operator, yield two different results. Discrepancies between such measurement results may be intolerable with respect to an error budget. Error budgets are constantly narrowing, as pointed out above, to meet the new demands of semiconductor circuit technologies. Therefore, it is desirable to determine correct astigmation corrector settings by automated means, and by using objective, well-defined focusing or sharpness criteria.

Many charged particle beam systems are already equipped with an automated focusing routine for the objective lens. A block diagram outlining the steps involved in such an automated focusing routine is displayed in FIG. 11. In step 1102 a focus sweep is initiated. In step 1104 the focus setting of an objective lens is determined. In step 1106 a target is scanned and an image containing information about the target is obtained. In step 1108 the information contained in the image obtained is analyzed to determine certain sharpness measures. In step 1109 a test is performed to determine whether sufficient sharpness measure information has been obtained in order to detect a sharpness maximum. If so, the objective lens is set for maximum sharpness in step 1110. If the information obtained thus far in the focus sweep is insufficient, then the focus setting of the objective lens must be varied and the process of steps 1104–1110 repeated.

Figure 11:
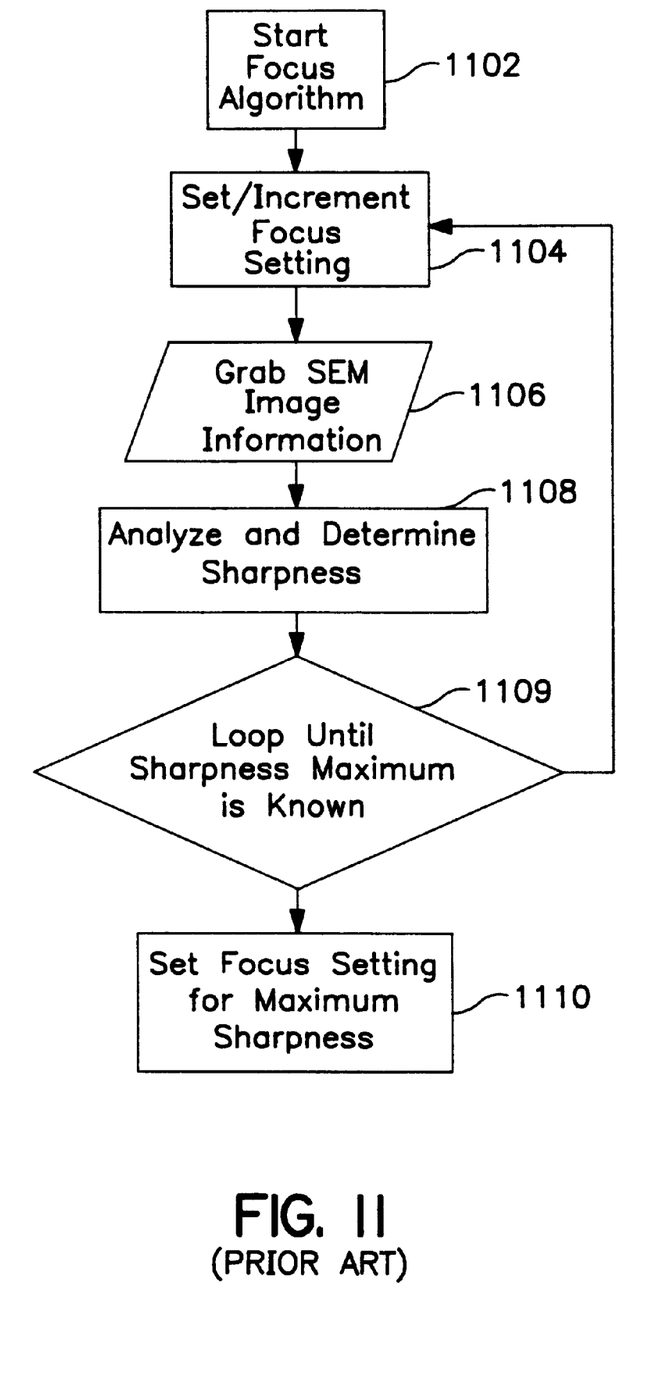
FIG. 11 is a block diagram showing the steps involved in a focus sweep of a scanning electron microscope.
Figure 12:
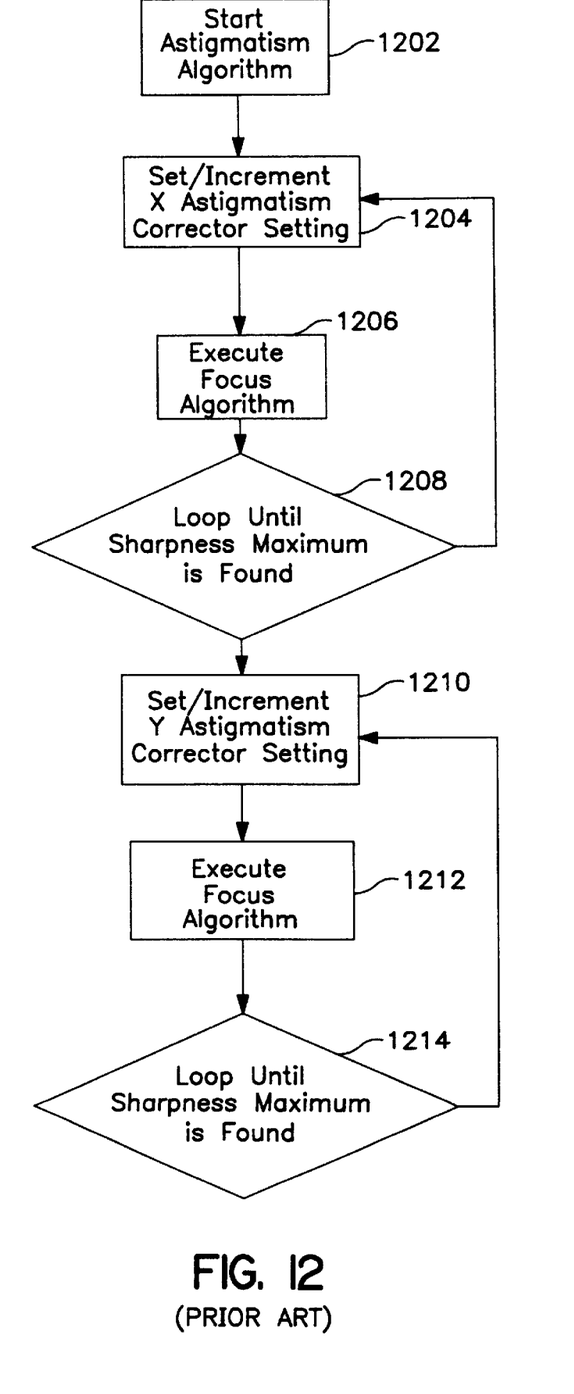
FIG. 12 is a block diagram showing the steps involved in a conventional astigmatism correction method.

A block diagram illustrating the steps involved in a conventional astigmatism correction method is displayed in FIG. 12. In step 1202 the astigmatism algorithm is initiated. In step 1204 the setting of the X-astigmatism corrector is determined. In step 1206 a focus sweep such as, for example, the focus sweep of FIG. 11 is initiated. In step 1208 a test is performed to determine whether sufficient sharpness measure information has been obtained in order to set the X-astigmatism corrector properly. If the information obtained thus far is insufficient, then steps 1204, 1206, and 1208 are repeated. The function of steps 1210, 1212, and 1214 performed for the Y-astigmatism corrector are analogous to the function of steps 1204, 1206, and 1208 performed for the X-astigmatism corrector. Conventional astigmatism correction methods systematically step through a range of magnet currents for one of the astigmation correctors. At each setting of the corrector magnet current, a best focus is determined for the tool, e.g. a SEM, using the automated focus routine of the tool. The automated focus routine may work according to a number of different principles each corresponding to a sharpness measure such as, for example, contrast maximizing, maximizing high spatial frequency signal content, or the like.

Central to its application, however, is the systematic stepping through the objective lens current (OLC) as well as other steps taken to ensure that a sharpness measure curve with a clear maximum is obtained. At each setting, the equivalent of an image of a sample is obtained from the tool for analysis. Best focus corresponds to a maximum in the sharpness measure curve. Best astigmation corrector (magnet current) setting is then determined by finding the maximum best focus sharpness measure as a function of corrector magnet current. The process can then be repeated for the second astigmation corrector. For this process to succeed, it is important for the sample to contain edges along the principal axes of the two astigmation correctors. It is also important that the focus routine be sensitive to the sharpness of those edges.

Conventional astigmation correction methods may involve many applications of the automated focus routine of the tool (see FIG. 12); this repetition detracts from the efficiency of the method and may cause sample damage. In addition, astigmation correction by human operators may no longer be sufficiently accurate for current and future industrial applications. Proprietary automated astigmation correction routines may not, by their nature, provide the user of the tool with the precise criteria and methodology used in the computation of the astigmatism error and its correction. The effectiveness and appropriateness of use of such proprietary routines is hence difficult to evaluate.

These deficiencies of conventional and proprietary methodologies, and of human operators, invoke a need to determine efficiently proper astigmation corrector settings by automated means using objective, well-defined focusing or sharpness criteria. An object of the present invention is to provide a methodology for computing and correcting astigmatism by automated means in a charged particle beam system based on sharpness criteria. Another object of the present invention is to provide users of charged particle beam systems with objective means for comparison of astigmatism error measurement and correction made by, for example, proprietary routines or the like.

SUMMARY OF THE INVENTION

To achieve these and other objects, and in view of its purposes, the present invention provides a method for determining and correcting an astigmatism error in a charged particle beam system. The method includes the steps of choosing a plurality of objective lens settings, collecting a plurality of images each corresponding to at least one of the plurality of objective lens settings, determining a plurality of sharpness measure values each associated with at least one of the plurality of images, finding a plurality of optimum sharpness values based on the plurality of sharpness measure values, computing the astigmatism error of the charged particle beam system based on the plurality of optimum sharpness values, and correcting the astigmatism error of the charged particle beam system by adjusting an astigmatism corrector.

It is to be understood that both the foregoing general description and the following detailed description are exemplary, but are not restrictive, of the invention. Although both the foregoing general description and the following detailed description focus on SEMs, the method of the present invention is also applicable to other charged particle beam systems such as microprobe machines and focused ion beam tools.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
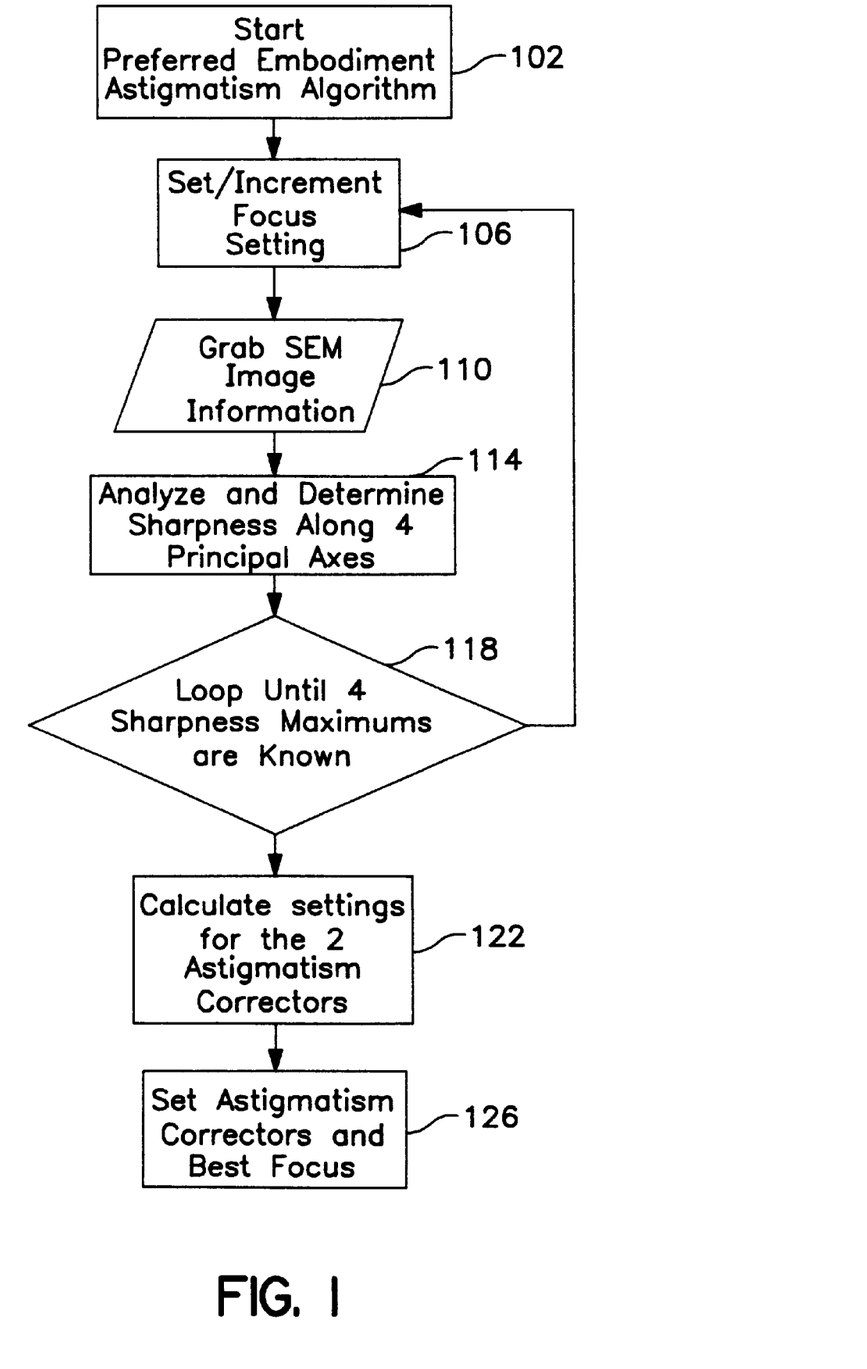
FIG. 1 is a block diagram illustrating steps in a method for correcting astigmatism in a scanning electron microscope in accordance with the present invention.

A flow diagram illustrating the method for determining an astigmatism error in a charged particle beam system according to the present invention is shown in FIG. 1. The algorithm begins at step 102. A focus sweep of the objective lens current is performed in the loop comprising steps 106, 110, 114, and 118. In step 106, the focus or objective lens current is set or incremented, then in steps 110 and 114 image data is collected and analyzed for each increment. A half-dozen saved images are a typical example of data from a single focus sweep of the objective lens current. For each of the images obtained at each of the settings of the objective lens current, several sharpness measure values are determined in step 114. Each image may be analyzed, for example, for sharpness measure values along the four directions corresponding to the principal axes of the two astigmation correctors. In step 118, optimum sharpness values (best focus) over all the objective lens current settings are found. For example, for each of the four directions, the best focus as a function of OLC may be determined. Finally, in step 122 the astigmatism error of the charged particle beam system is computed from the optimum sharpness values and from known rigid properties of the system. It should be emphasized that the method outlined above for computing the astigmatism error may be completed using image data from a single focus sweep.

The astigmatism error and optimal sharpness value (best focus) information thus deduced can in turn be used to compute the proper settings for the astigmatism correctors, as indicated in step 126. For example, based on the best focus settings in each of the four directions, as a function of OLC, the proper current settings for the two corrector magnets and simultaneously for the objective lens may be calculated.

In a first exemplary embodiment of the present invention, the correct astigmation coil compensation settings are computed by using an auto-focus algorithm of a SEM on four neighbor lines patterned on a wafer with different orientations: vertical, horizontal, plus forty-five degrees, and minus forty-five degrees. If all four best focus values result in the same corrector current setting, then astigmatism compensation has been correctly set. If the best focus values differ then, after a single focus sweep, the correct current settings for the two quadrupole correctors may be computed from the four best focus value determinations.

Each astigmation corrector distorts the electron beam spot into an ellipse. For a SEM in which one of the astigmation correctors produces an ellipse with major and minor axes in the vertical and horizontal directions, often called the Y-astigmation corrector, the correct change in corrector current setting is proportional to the difference between the best focus value associated with the vertical and horizontal orientations. Typical quadrupole correctors have a second corrector rotated by forty-five degrees with respect to the first. In the present embodiment, the second corrector, often called the X-astigmation corrector, distorts the electron beam spot into an ellipse with major and minor axes along the plus and minus forty-five degree directions. The correct change in corrector current setting for the X-astigmation corrector is proportional to the difference between the optimum focus measure values associated with the plus and minus forty-five degree orientations.

The constants of proportionality may be determined by plotting the best focus values for the four line orientations as each of the two corrector settings is systematically changed. These will be straight line trends. In the present embodiment, the lines associated with the plus and minus forty-five degree orientations will remain flat as a function of Y-astigmation corrector current change, while the vertical and horizontal best focus trends will have equal but opposite slopes, say "m." The Y-astigmation corrector proportionality constant is then 1/(2 m). Similarly, the lines associated with the vertical and horizontal orientations will remain flat as a function of X-astigmation corrector current change, while the plus and minus forty-five degree best focus trends will have equal but opposite slopes, say "n." The X-astigmation corrector proportionality constant is then 1/(2 n).

Figure 2A:
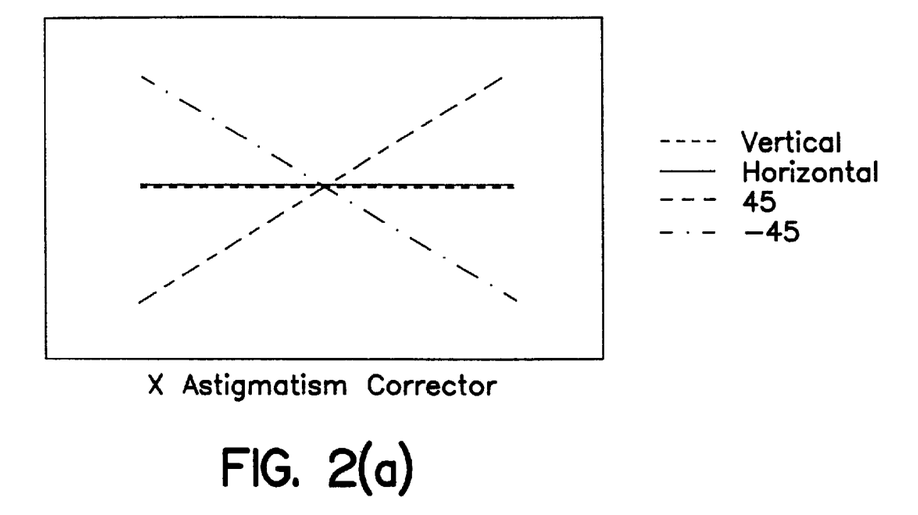
FIGS. 2(a) and 2(b) are graphs that show how the best focus values may vary around the ideal operating point for the case where the quadrupole principal axes are aligned with four line orientations, for the X- and Y-astigmatism correctors respectively.
Figure 2B:
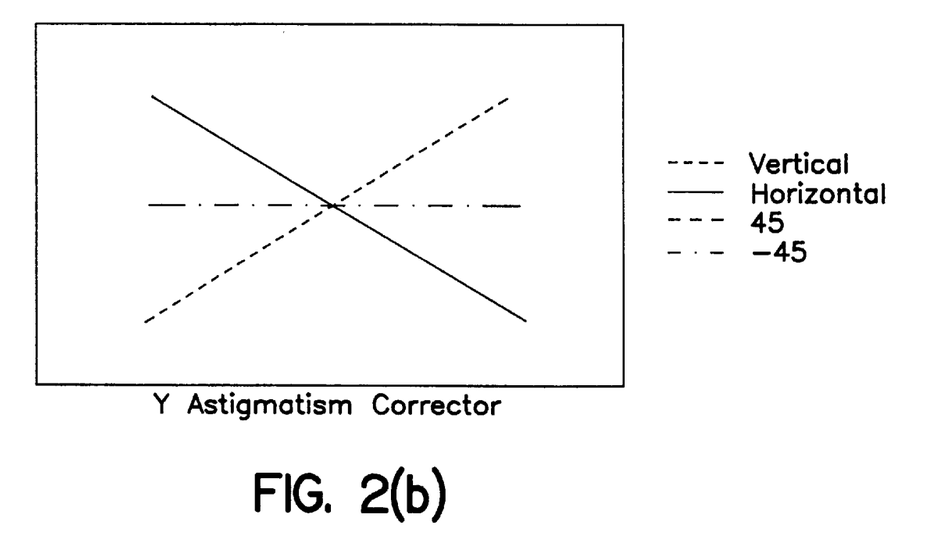

FIGS. 2($a$) and 2($b$) are graphs of an exemplary relationship between the best focus value and the X- and Y-astigmatism corrector current settings, respectively, for each of the four above-mentioned orientation lines. It should be noted that the graphs show rigid properties of the SEM. That is, the properties displayed in FIGS. 2($a$) and 2($b$) may be, for example, provided by the manufacturer of the SEM. The graphs displayed in FIGS. 2($a$) and 2($b$) show how the best focus values may vary around the ideal operating point in the case where the quadrupole principal axes are aligned with the four line orientations. The ideal operating point is found by keeping the X-astigmatism corrector current setting at its proper value for compensation while the Y-astigmatism setting is changed and vice versa. In FIG. 2($a$), the correct setting for the X-astigmatism corrector current is given by the point of intersection of the lines associated with the plus forty-five degree and minus forty-five degree orientations. Similarly, in FIG. 2($b$), the correct setting for the Y-astigmatism corrector current is given by the point of intersection of the lines associated with the vertical and horizontal orientations.

Figure 3A:
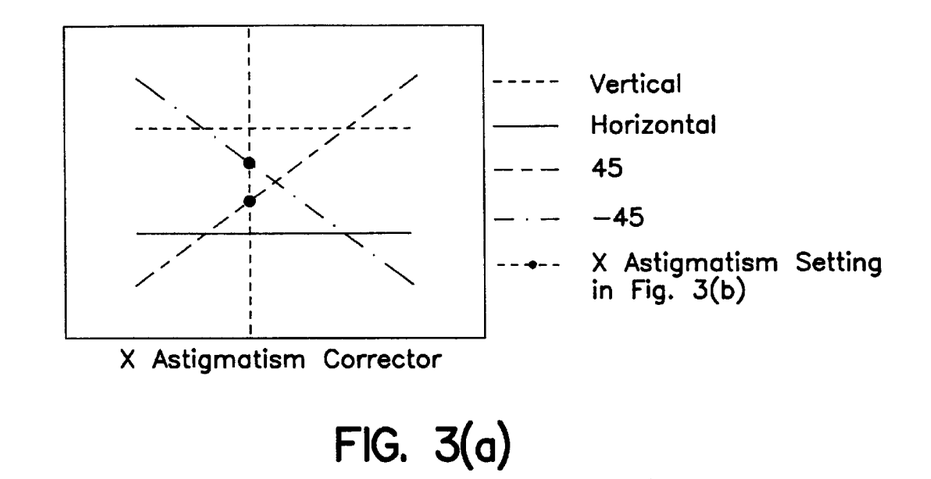
FIG. 3(a) is a graph that shows how the best focus values may vary around an arbitrary operating point such that the Y-astigmatism corrector setting is not ideal while the X-astigmatism corrector setting is varied, for the case where the quadrupole principal axes are aligned with four line orientations.
Figure 3B:
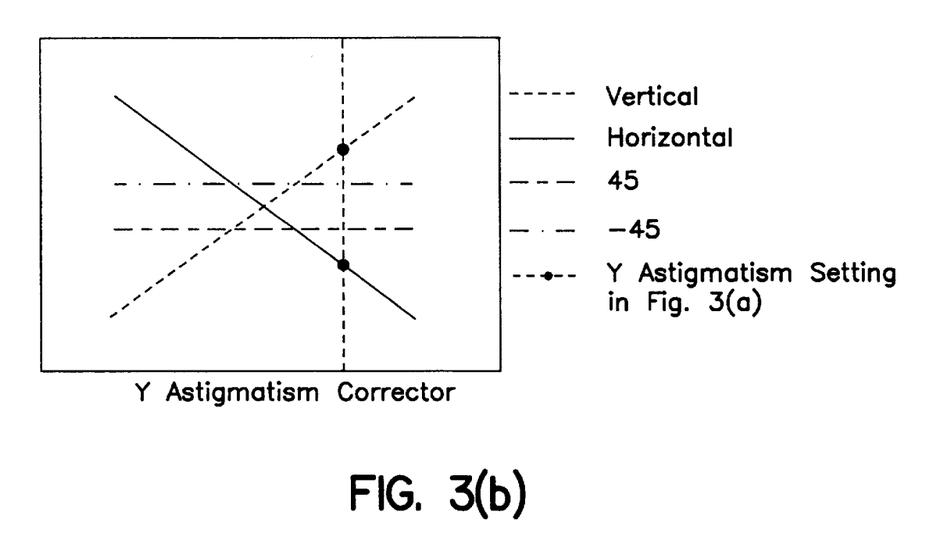
FIG. 3(b) is a graphs that shows how the best focus values may vary around an arbitrary operating point such that the X-astigmatism corrector setting is not ideal while the Y-astigmatism corrector setting is varied, for the case where the quadrupole principal axes are aligned with four line orientations.

FIGS. 3($a$) and 3($b$) show how the best focus for the various line orientations varies around an arbitrary operating point such that the X-astigmatism corrector current setting is not ideal as the Y-astigmatism corrector current is varied, and vice versa. The quadrupole axes are aligned in this case, however, with the various line orientations.

A second embodiment of the present invention addresses the more general but less common case in which the quadrupole corrector axes are not aligned with the vertical, horizontal, plus and minus forty-five degree orientations. The best focus trend slopes will all be non-zero. In order to find and correct the astigmatism error, the desired change in X- and Y-astigmatism corrector current is computed. The proper Y-astigmation corrector current change is equal to the difference between vertical and horizontal best focus values times a first constant plus the difference between plus forty-five degree and minus forty-five degree best focus values times a second constant. The proper X-astigmation corrector current change is equal to the difference between vertical and horizontal best focus values times a third constant plus the difference between plus forty-five degree and minus forty-five degree best focus values times a fourth constant.

Figure 4A:
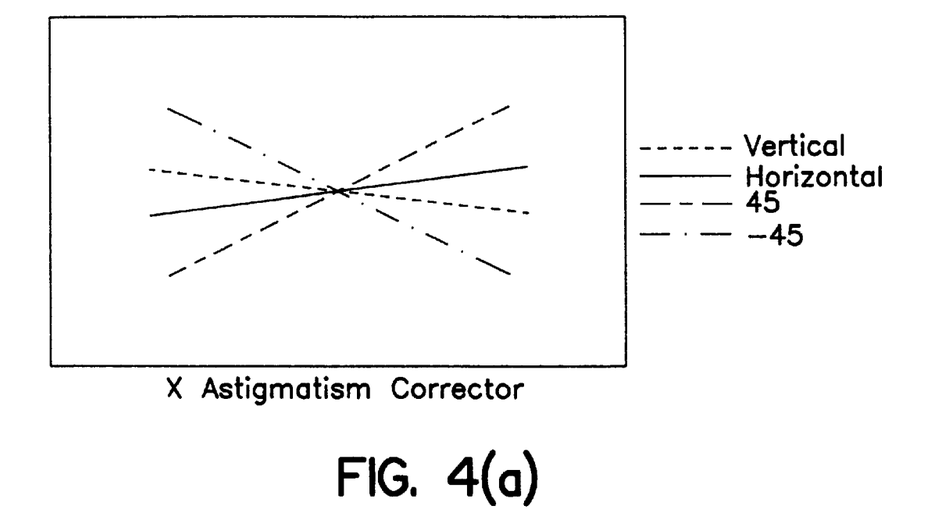
FIGS. 4(a) and 4(b) are graphs that show how the best focus values may vary around the ideal operating point for the case where the quadrupole principal axes are not perfectly aligned with four line orientations, for the X- and Y-astigmatism correctors, respectively.
Figure 4B:
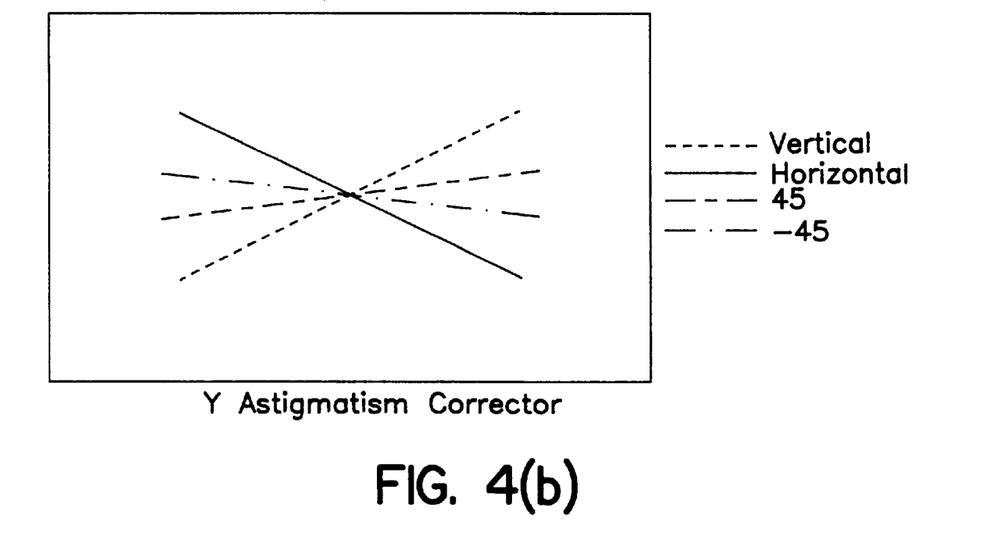

FIGS. 4($a$) and 4($b$) show how the best focus for the four line orientations varies around the ideal operating point for the case when the quadrupole principal axes are not aligned with the four line orientations. The symmetry of the orientation pairs should be noted. That is, best focus lines associated with orthogonal orientations have equal but opposite slopes. The focus trends illustrated in FIGS. 4($a$) and 4($b$) may be used to determine the first through fourth constants of proportionality. A linear algebraic calculation may be performed to provide the four constants of proportionality.

Figure 5A:
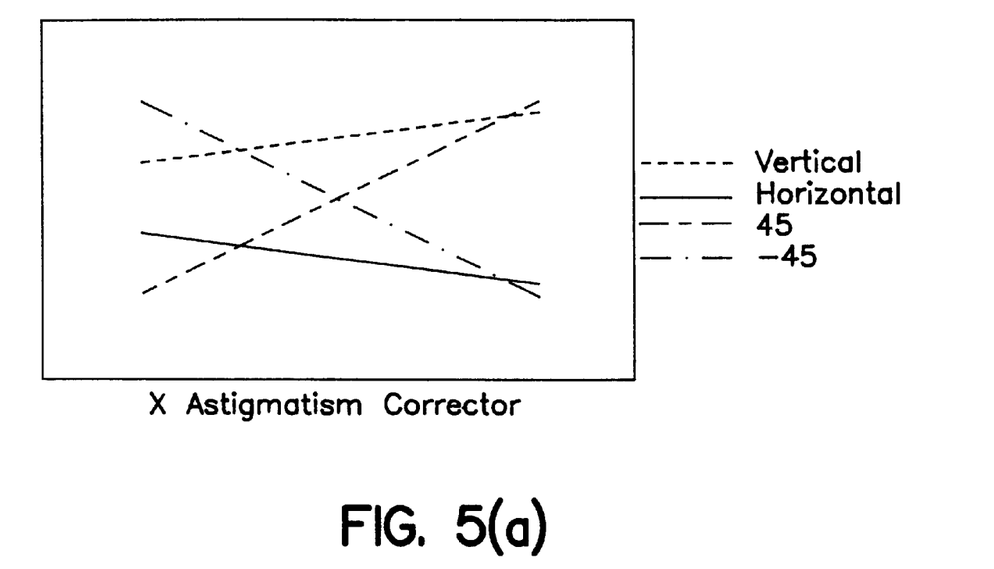
FIGS. 5(a) and 5(b) are graphs that show how the best focus values may vary around an arbitrary operating point for the case where the quadrupole principal axes are not perfectly aligned with four line orientations, for the X- and Y-astigmatism correctors, respectively.
Figure 5B:
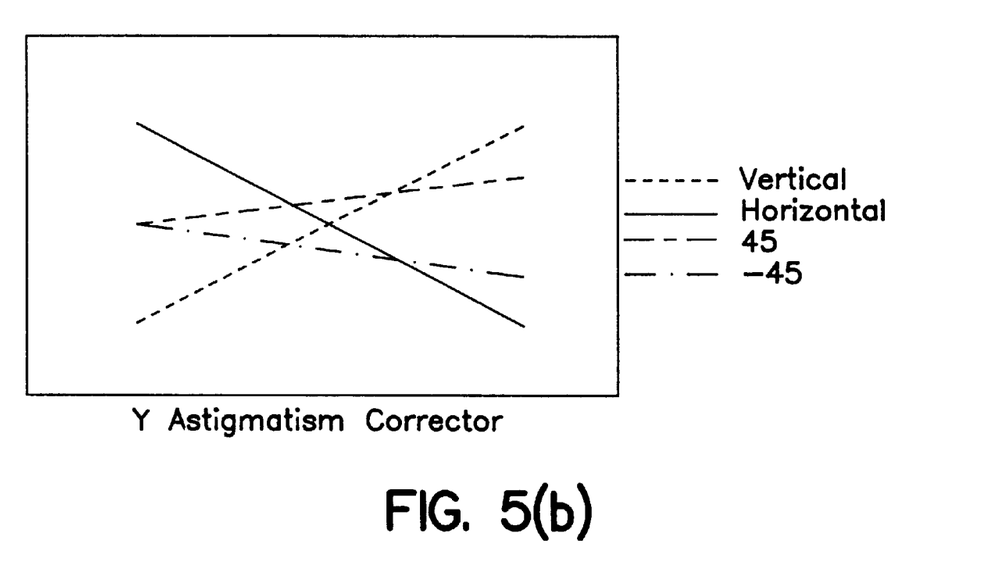

FIGS. 5($a$) and 5($b$) show the case in which the quadrupole axes are not aligned with the four line orientations and the variation of each astigmatism corrector current value is performed while the other astigmatism corrector current value is not at the ideal value for compensation. FIGS. 5($a$) and 5($b$) illustrate that the phenomenon of astigmatism associated with the present invention could be difficult to interpret. The method of the present invention may be used for rapid astigmatism correction based on such graphs.

The constants of proportionality in the general case may be determined as follows: the SEM best focus is measured and graphed as a function of X- and Y-astigmatism corrector setting for the four line orientations as shown, for example, in FIGS. 4(a) and 4(b). For X-astigmatism, denote the slopes of the vertical and horizontal line trends by p and −p, respectively, and the slopes of the plus and minus forty-five degree line trends by q and −q, respectively. For Y-astigmatism, denote the slopes of the vertical and horizontal line trends by r and −r, respectively, and the slopes of the plus and minus forty-five degree line trends by −s and s, respectively. When the corrector coils are wound with the same number of windings and are located at the same position, then the high symmetry of the configuration implies p=s and q=r. These assumptions regarding coil windings and positioning are not, however, made in the following. Denote the best focus values for the horizontal, vertical, plus forty-five degrees, and minus forty-five degrees line orientations, respectively, by $BF_h$, $BF_v$, $BF_{+45}$, $BF_{-45}$. The best focus values may be computed by $$BF_v = p^*\Delta X_{astigm} + r^*\Delta Y_{astigm} + BF_o$$

$$BF_h = -p^*\Delta X_{astigm} - r^*\Delta Y_{astigm} + BF_o$$

$$BF_{+45} = q^*\Delta X_{astigm} - s^*\Delta Y_{astigm} + BF_o$$

$$BF_{-45} = -q^*\Delta X_{astigm} + s^*\Delta Y_{astigm} + BF_o,$$

where $BF_o$ is the common best focus value at optimal astigmatism correction, $\Delta X_{astigm}$ and $\Delta Y_{astigm}$ are the respective X-astigmation and Y-astigmation setting differences from optimal compensation. The proper change in corrector settings for the two astigmatism correctors, $\Delta X_{astigm}$ and $\Delta Y_{astigm}$ may be determined by solving an equation of the following form:

$$\Delta Y_{astigm} = K_1^*(BF_v - BF_h) + K_2^*(BF_{+45} - BF_{-45})$$

$$\Delta X_{astigm} = k_3^*(BF_v - BF_h) + K_4^*(BF_{+45} - BF_{-45}),$$

where $$K_1 = \frac{q/2}{qr + ps}, K_2 = \frac{-p/2}{qr + ps}, K_3 = \frac{s/2}{qr + ps}, \text{ and } K_4 = \frac{r/2}{qr + ps}.$$

The most sensitive determinations of the correct astigmatism corrector current values are performed when the line orientations patterned on a target are aligned with the quadrupole axes. When such alignment is achieved, only one difference measurement is involved for each astigmatism corrector. The corrector axes orientation yielding alignment may be determined from the trend lines on a stigmation target by finding the rotation transformation that reduces each corrector current value change, $\Delta Y_{astigm}$ and $\Delta X_{astigm}$, to depend on only one rotated set of orthogonal line orientations.

Because many modern SEMs provide a readout of their best focus setting, for example, the method of the present invention may be applied immediately regardless of the best focus algorithm used. For charged particle beam systems that determine a best focus setting along a specific direction, which can be rotated, a variation of the method of the present invention may be applied. For a wafer geometry with edges in all directions, such as a contact hole, the best focus is determined along all four of the astigmation corrector axes. The corrector current value changes can then be calculated as above. This methodology may be implemented in a CD-SEM, in software for example, to provide a fully automatic astigmation correction routine.

If the line orientations on a target are sufficiently close, so that they are at the same SEM working distance, then only three focus measurement may be needed to determine the two corrector current value changes, $\Delta Y_{astigm}$ and $\Delta X_{astigm}$. In practice, a fourth measurement is useful as a consistency check. If a contact hole geometry may be used, then the closeness condition is generally guaranteed.

Figure 6:
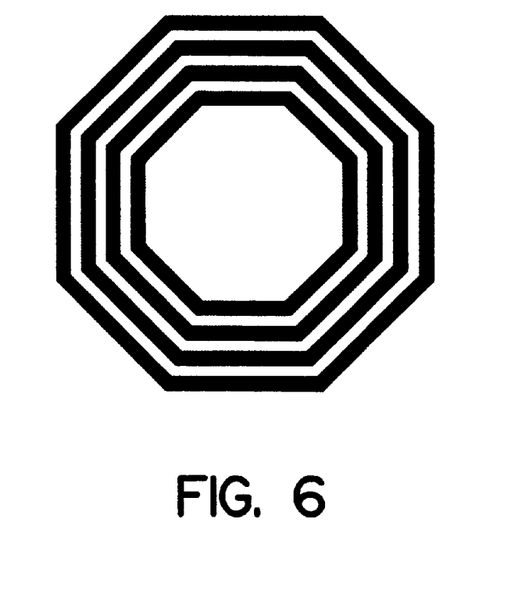
FIG. 6 is an example of a stigmation target.

When performing measurements on semiconductor wafers, a special stigmation target (sometimes referred to as a kerf target) would generally guarantee the ability to measure the astigmatism error regardless of chip patterns. An important property of the stigmation target is that the straight line orientations appear in equal proportions. An example of a stigmation target is shown in FIG. 6. Such a target may be used on different types of SEMs. For example, for a SEM in which the focus algorithm is not known, a field of view is chosen such that one line orientation is visible, then the visible line is scanned. Different directions are scanned by changing the field of view for each of the line orientations. The images obtained may be used to determine the best focus settings. For a SEM in which the direction along which best focus is determined may be specified, a field of view including the whole target may be considered.

Many conventional auto-stigmation techniques rely on specialized non-wafer targets or proprietary analyses, where the relationship to actual line width measurements is not quantitatively clear. The method of the present invention provides a quantitative way to judge other astigmation correction techniques. In the present invention the astigmatism error is determined by measurements in terms of the actual focus errors.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for determining an astigmatism error in a charged particle beam system, which comprises:
    choosing a plurality of objective lens settings;
    collecting a plurality of images each corresponding to at least one of said plurality of objective lens settings;
    determining a plurality of sharpness measure values each associated with at least one of said plurality of images;
    finding a plurality of optimum sharpness values based on said plurality of sharpness measure values; and
    computing said astigmatism error of the charged particle beam system based on said plurality of optimum sharpness values.

2. The method according to claim 1, wherein said plurality of images are collected by sweeping a stigmation target.

3. The method according to claim 1, wherein said plurality of images are collected during a single focus sweep.

4. The method according to claim 1, wherein said plurality of sharpness measure values divide into a plurality of sets of sharpness measure values each associated with at least one of a plurality of image feature orientations.

5. The method according to claim 4, wherein each of said plurality of optimum sharpness values is found based on at least one of said plurality of sets of sharpness measure values.

6. The method according to claim 5, wherein said astigmatism error of the charged particle beam system is computed based on a linear combination of said plurality of optimum sharpness values.

7. The method according to claim 4, wherein said plurality of image feature orientations include a horizontal orientation, a vertical orientation, a forty-five degree orientation, and a negative forty-five degree orientation.

8. The method according to claim 7, wherein said plurality of optimum sharpness values include a first optimum sharpness value associated with said horizontal orientation, a second optimum sharpness value associated with said vertical orientation, a third optimum sharpness value associated with said forty-five degree orientation, and a fourth optimum sharpness value associated with said negative forty-five degree orientation.

9. The method according to claim 8, wherein said astigmatism error of the charged particle beam system is computed based on a linear combination of a first difference, between said first optimum sharpness value and said second optimum sharpness value, and a second difference, between said third optimum sharpness value and said fourth optimum sharpness value.

10. The method according to claim 1, wherein said astigmatism error includes an X-astigmatism error and a Y-astigmatism error.

11. The method according to claim 1, wherein the charged particle beam system is one of the group consisting of a scanning electron microscope, a microprobe machine, and a focused ion beam tool.

12. A method of correcting astigmatism in a charged particle beam system, which comprises:

choosing a plurality of objective lens settings;

collecting a plurality of images each corresponding to at least one of said plurality of objective lens settings;

determining a plurality of sharpness measure values each associated with at least one of said plurality of images;

finding a plurality of optimum sharpness values based on said plurality of sharpness measure values;

computing an astigmatism error of the charged particle beam system based on said plurality of optimum sharpness values; and correcting said astigmatism error of the charged particle beam system by adjusting an astigmatism corrector.

13. The method according to claim 12, wherein said astigmatism corrector is a magnetic quadrupole.

14. The method according to claim 13, wherein a corrector current associated with said magnetic quadrupole is adjusted based on said astigmatism error.

15. The method according to claim 12, wherein said astigmatism corrector is a plurality of magnetic quadrupoles.

16. The method according to claim 15, wherein a plurality of corrector currents associated with said plurality of magnetic quadrupoles are each adjusted based on said astigmatism error.

17. The method according to claim 12, wherein said plurality of images are collected by sweeping a stigmation target.

18. The method according to claim 12, wherein said plurality of sharpness measure values divide into a plurality of sets of sharpness measure values each associated with at least one of a plurality of image feature orientations.

19. The method according to claim 18, wherein each of said plurality of optimum sharpness values is found based on at least one of said plurality of sets of sharpness measure values.

20. The method according to claim 19, wherein said astigmatism error of the charged particle beam system is computed based on a linear combination of said plurality of optimum sharpness values.

21. The method according to claim 18, wherein said plurality of image feature orientations include a horizontal orientation, a vertical orientation, a forty-five degree orientation, and a negative forty-five degree orientation.

22. The method according to claim 21, wherein said plurality of optimum sharpness values include a first optimum sharpness value associated with said horizontal orientation, a second optimum sharpness value associated with said vertical orientation, a third optimum sharpness value associated with said forty-five degree orientation, and a fourth optimum sharpness value associated with said negative forty-five degree orientation.

23. The method according to claim 22, wherein said astigmatism error of the charged particle beam system is computed based on a linear combination of a first difference, between said first optimum sharpness value and said second optimum sharpness value, and a second difference, between said third optimum sharpness value and said fourth optimum sharpness value.

24. The method according to claim 12, wherein said astigmatism errdr includes an X-astigmatism error and a Y-astigmatism error.

25. The method according to claim 12, wherein the charged particle beam system is one of the group consisting of a scanning electron microscope, a microprobe machine, and a focused ion beam tool.

26. The method according to claim 12, wherein said plurality of images are collected during a single focus sweep.

27. A method of correcting astigmatism in a scanning electron microscope, which comprises:

choosing a plurality of objective lens settings;

collecting a plurality of images each corresponding to at least one of said plurality of objective lens settings by sweeping a stigmation target during a single focus sweep;

determining a plurality of sharpness measure values by analyzing said images, said plurality of sharpness measure values divided into a plurality of sets of sharpness measure values, each of said sets associated with at least one of a plurality of image feature orientations including a horizontal orientation, a vertical orientation, a forty-five degree orientation and a negative forty-five degree orientation;

finding a plurality of optimum sharpness values based on at least one of said plurality of sets of sharpness measure values;

computing an astigmatism error including an X-astigmatism error and a Y-astigmatism error of the scanning electron microscope based on a linear combination of said plurality of optimum sharpness values and at least one of a plurality of rigid properties of the scanning electron microscope; and correcting said astigmatism error of the scanning electron microscope by adjusting a plurality of corrector currents associated with a plurality of magnetic quadrupoles based on said astigmatism error.

* * * * *